(12) United States Patent
Joko

(10) Patent No.: US 9,647,443 B2
(45) Date of Patent: May 9, 2017

(54) SEMICONDUCTOR DEVICE

(71) Applicant: Mitsubishi Electric Corporation, Tokyo (JP)

(72) Inventor: Motonobu Joko, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 408 days.

(21) Appl. No.: 14/294,748

(22) Filed: Jun. 3, 2014

(65) Prior Publication Data
US 2015/0116885 A1 Apr. 30, 2015

(30) Foreign Application Priority Data

Oct. 29, 2013 (JP) ................................. 2013-223804

(51) Int. Cl.
| H02H 5/04 | (2006.01) |
| H02H 3/08 | (2006.01) |
| H02H 3/04 | (2006.01) |
| H02H 3/087 | (2006.01) |
| H03K 17/082 | (2006.01) |
| H03K 17/18 | (2006.01) |
| H03K 17/08 | (2006.01) |

(52) U.S. Cl.
CPC ................ *H02H 3/08* (2013.01); *H02H 3/04* (2013.01); *H02H 3/087* (2013.01); *H02H 5/041* (2013.01); *H03K 17/0828* (2013.01); *H03K 17/18* (2013.01); *H03K 2017/0806* (2013.01)

(58) Field of Classification Search
USPC ........................................................ 361/104
See application file for complete search history.

(56) References Cited

U.S. PATENT DOCUMENTS 5,119,265 A 6/1992 Qualich et al.
5,485,342 A * 1/1996 Sugino .................. B41J 29/387
361/104

(Continued)

FOREIGN PATENT DOCUMENTS

CN 201673576 U 12/2010
CN 103187718 A 7/2013
(Continued)

OTHER PUBLICATIONS

ProQuest Dialog, English translation of EP 1630923; Sep. 21, 2016.*

(Continued)

*Primary Examiner* — Ronald W Leja
(74) *Attorney, Agent, or Firm* — Studebaker & Brackett PC

(57) ABSTRACT

A fuse, a resistor, and a transistor, which serve as an abnormality history setting unit, are provided in series between external terminals. The transistor receives a specific abnormality detection signal on its base from an abnormality detection circuit. The specific abnormality detection signal becomes "H" level in order to bring the transistor into an on state when a specific abnormal phenomenon to be detected occurs out of plural types of abnormal phenomena. The abnormality history setting unit executes an abnormality history operation for turning on the transistor and allowing a current exceeding a disconnection level to flow through the fuse provided between the external terminals to disconnect the fuse.

12 Claims, 9 Drawing Sheets

(56) References Cited

U.S. PATENT DOCUMENTS

| | | | | |
|---|---|---|---|---|
| 5,856,711 | A * | 1/1999 | Kato | H02H 3/087 307/10.6 |
| 7,148,504 | B2 | 12/2006 | Yamada | |
| 2002/0047636 | A1* | 4/2002 | Yamamoto | H02H 11/003 315/291 |
| 2003/0142449 | A1* | 7/2003 | Iwata | H02H 1/0015 361/58 |
| 2004/0131329 | A1* | 7/2004 | Ogawa | G11B 15/00 386/277 |
| 2014/0297144 | A1* | 10/2014 | Wakao | H03K 17/0822 701/68 |
| 2015/0085410 | A1* | 3/2015 | Nishimoto | H02H 3/08 361/57 |
| 2015/0116885 | A1* | 4/2015 | Joko | H02H 3/08 361/104 |
| 2015/0263549 | A1* | 9/2015 | Lee | H01M 10/48 361/93.4 |

FOREIGN PATENT DOCUMENTS

| | | |
|---|---|---|
| EP | 1630923 A1 | 3/2006 |
| JP | H04-101613 A | 4/1992 |
| JP | H07-078933 A | 3/1995 |
| JP | H08-195411 A | 7/1996 |
| JP | H11-262270 A | 9/1999 |
| JP | 2001-141287 A | 5/2001 |
| JP | 2003-88093 A | 3/2003 |
| JP | 2005-311213 A | 11/2005 |
| JP | 2006-093278 A | 4/2006 |
| JP | 2008-148104 A | 6/2008 |

OTHER PUBLICATIONS

An Office Action issued by the German Patent Office on Jun. 17, 2016, which corresponds to German Patent Application No. 10 2014 217 270.5 and is related to U.S. Appl. No. 14/294,748; with English language translation.

An Office Action; "Notification of Reasons for Refusal," issued by the Japanese Patent Office on Sep. 27, 2016, which corresponds to Japanese Patent Application No. 2013-223804 and is related to U.S. Appl. No. 14/294,748; with English language translation.

An Office Action issued by the Chinese Patent Office on Jan. 5, 2017, which corresponds to Chinese Patent Application No. 201410525061X and is related to U.S. Appl. No. 14/294,748; with English language translation; 15 pp.

* cited by examiner

F I G . 1
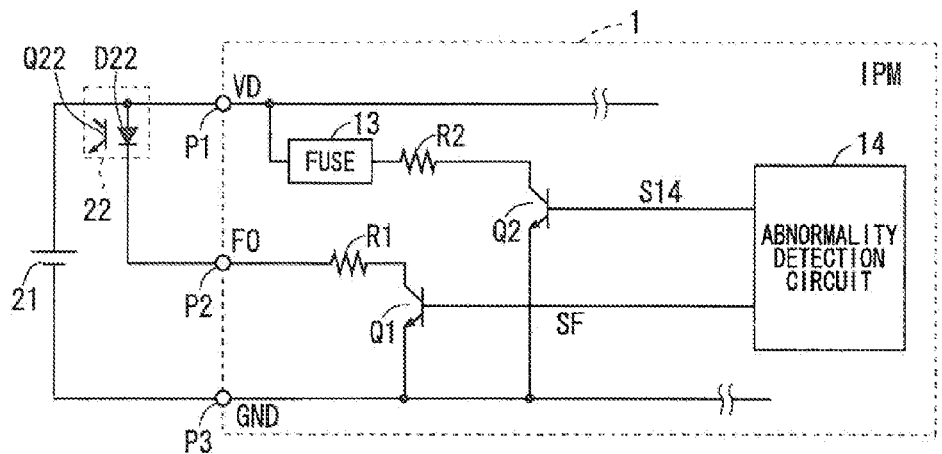
F I G . 2
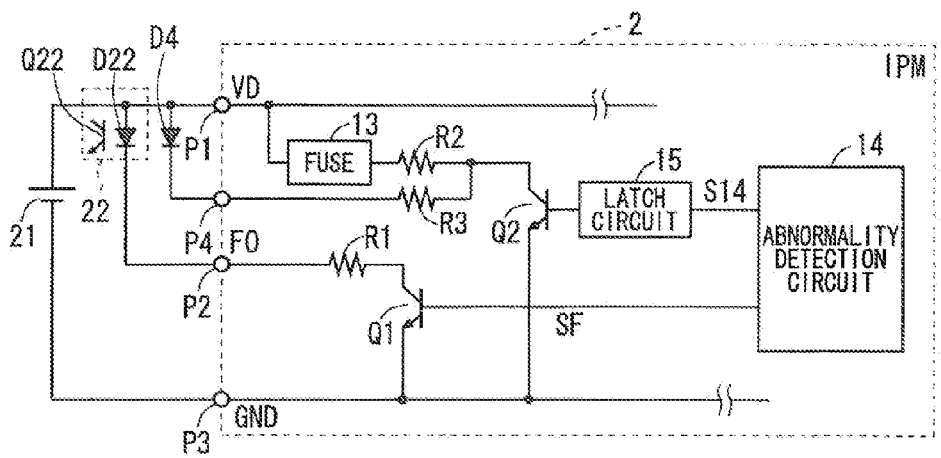

F I G . 3
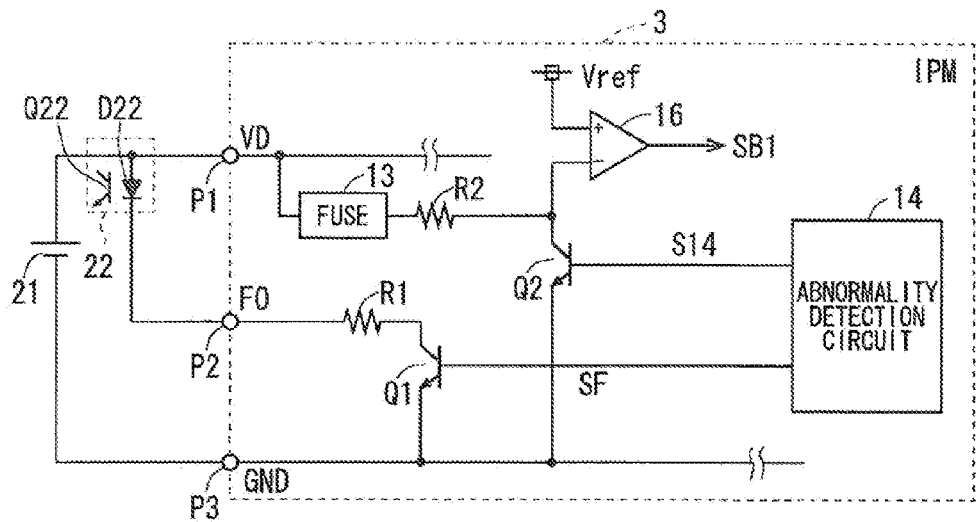
F I G . 4
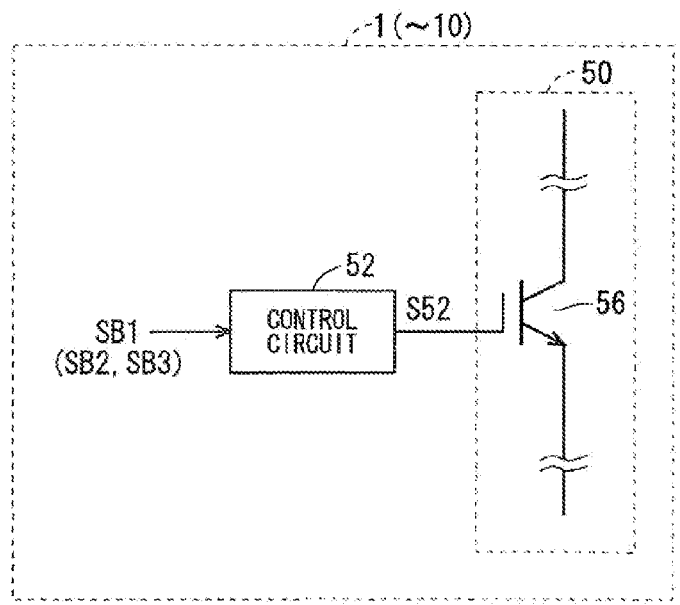

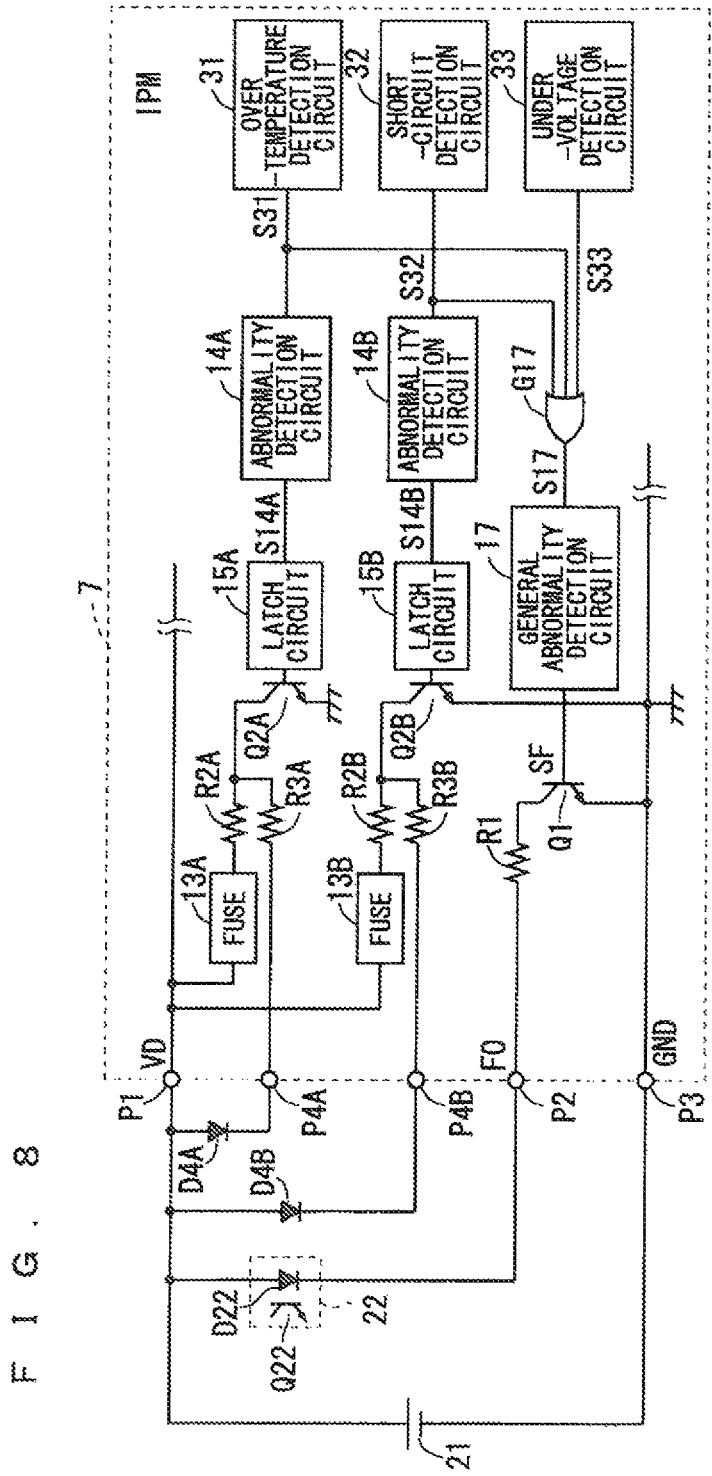
F I G . 8

FIG. 11

| | ALARM | | | | RISK LEVEL LOW | | | | RISK LEVEL MIDDLE | | | | FATAL | |
|---|---|---|---|---|---|---|---|---|---|---|---|---|---|---|
| | 100°C OR HIGHER (HIGHER THAN 100°C) | | | | 135°C OR HIGHER (HIGHER THAN 135°C) | | | | 150°C OR HIGHER (HIGHER THAN 150°C) | | | | 175°C OR HIGHER (HIGHER THAN 175°C) | |
| | trip | reset | | | trip | reset | | | trip | reset | | | trip | reset |
| SHUT OFF IGBT | NOT | NOT | | | SHUTOFF | NOT MORE THAN RESET LEVEL | | | SHUTOFF | CONTROL POWER SUPPLY RESET | | | SHUTOFF | REPLACING FUSE |
| ERROR OUTPUT SIGNAL FO | OUTPUT DURING Error PERIOD | NOT MORE THAN RESET t LEVEL | | | OUTPUT AT ALL TIMES | CONTROL POWER SUPPLY RESET | | | OUTPUT AT ALL TIMES | CONTROL POWER SUPPLY RESET | | | OUTPUT AT ALL TIMES | REPLACING FUSE |
| LED | NOT EMIT | NOT EMIT | | | NOT EMIT | NOT EMIT | | | EMIT | CONTROL POWER SUPPLY RESET | | | EMIT | REPLACING FUSE |
| FUSE | NOT DISCONNECTED | NOT DISCONNECTED | | | NOT DISCONNECTED | NOT DISCONNECTED | | | NOT DISCONNECTED | NOT DISCONNECTED | | | DISCONNECTED | REPLACING FUSE |

SEMICONDUCTOR DEVICE

BACKGROUND OF THE INVENTION

Field of the Invention

The present invention relates to a semiconductor device such as an IPM (Intelligent Power Module), and more particularly to a semiconductor device having a history function of an occurrence of an abnormal phenomenon.

Description of the Background Art

A conventional semiconductor device such as an IPM generally has a shutoff protection function for shutting off (turning off) a semiconductor element to be protected and outputting an error signal to the outside in order to protect a power chip on which a semiconductor element such as IGBT (Insulated Gate Bipolar Transistor) is mounted upon an occurrence of abnormality (error) such as high temperature generation and overcurrent. Examples of such semiconductor device having the shutoff protection function include an IPM disclosed in Japanese Patent Application Laid-Open No. 2003-88093.

The conventional IPM having the shutoff protection function shuts off a semiconductor element to be protected and outputs an error signal to the outside, but does not leave a history as to whether an abnormal phenomenon that causes the shutoff of the IPM occurs or not. Therefore, it is extremely difficult to find out the cause after the IPM is shut off due to an occurrence of trouble such as various abnormal phenomena. Specifically, the conventional IPM having the shutoff protection function entails a problem that an appropriate measure for an error after the shutoff cannot be taken, since the IPM cannot recognize why the semiconductor element is shut off.

The shutoff protection function of the conventional semiconductor device generally performs a shutoff protection operation uniformly at the time when the abnormal phenomenon exceeds a certain prescribed level. Specifically, the conventional semiconductor device shuts off the semiconductor element to be protected without determining whether the abnormal phenomenon causing the shutoff has a noteworthy level or a fatal error level. Therefore, the conventional semiconductor device has a problem of being non-user-friendly.

SUMMARY OF THE INVENTION

The present invention aims to provide a semiconductor device that leaves a history as to whether a specific abnormal phenomenon to be detected occurs or not, and can take an appropriate measure for an error.

A semiconductor device according to the present invention includes first and second external power supply terminals, an abnormality detection circuit, and an abnormality history setting unit.

A power supply voltage is applied to the first external power supply terminal, and the second external power supply terminal is set to a reference potential.

The abnormality detection circuit outputs a specific abnormality detection signal indicating whether the specific abnormal phenomenon to be detected occurs or not.

The abnormality history setting unit includes a fuse provided between the first and second external power supply terminals, and executes an abnormality history operation for disconnecting the fuse by allowing a current to flow through the fuse, when the specific abnormality detection signal indicates the occurrence of the specific abnormal phenomenon.

The semiconductor device according to the present invention can recognize a history as to whether the specific abnormal phenomenon to be detected occurs or not from a condition as to whether the fuse is disconnected or not by the abnormality history operation executed by the abnormality history setting unit. As a result, the semiconductor device can promptly make an analysis and take a measure after the occurrence of the specific abnormal phenomenon. Accordingly, the life of the semiconductor device can be prolonged by using the semiconductor device with appropriate measures for error prevention being employed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram illustrating an abnormality history setting unit in an IPM according to a first preferred embodiment of the present invention;

FIG. 2 is a circuit diagram illustrating an abnormality history setting unit in an IPM according to a second preferred embodiment of the present invention;

FIG. 3 is a circuit diagram illustrating an abnormality history setting unit in an IPM according to a third preferred embodiment of the present invention;

FIG. 4 is an explanatory view schematically illustrating a shutoff control system for an IGBT to be protected by an IGBT shutoff signal;

FIG. 8 is a circuit diagram illustrating an abnormality history setting unit in an IPM according to a seventh preferred embodiment of the present invention;

FIG. 11 is an explanatory view illustrating an abnormality history operation and first to third abnormal recognizing operations of the IPM according to the ninth preferred embodiment in a form of a table.

DESCRIPTION OF THE PREFERRED EMBODIMENTS

First Preferred Embodiment

Figure 5:
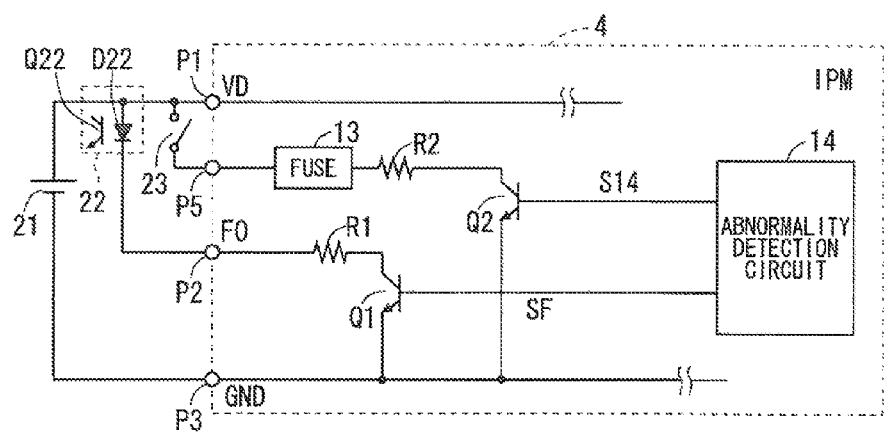
FIG. 5 is a circuit diagram illustrating an abnormality history setting unit in an IPM according to a fourth preferred embodiment of the present invention.

FIG. 1 is a circuit diagram schematically illustrating an abnormality output unit and an abnormality history setting unit of an IPM 1, and its periphery according to a first preferred embodiment of the present invention.

The IPM 1 includes an external terminal P1 (first external power supply terminal), to which a power supply voltage VD (a positive electrode of a power supply 21) is applied, as an external terminal, an external terminal P3 (second external power supply terminal) set to a ground voltage GND (a negative electrode of the power supply 21) that is a reference potential, and an external terminal P2 (external detection terminal) outputting an error output signal (FO) (False Out).

The abnormality output unit includes a (NPN bipolar) transistor Q1 for detecting the FO and a resistor R1 for the FO. The resistor R1 and the transistor Q1 are provided between the external terminals P2 and P3 in series. Specifically, one end of the resistor R1 is connected to the external terminal P2, the other end of the resistor R1 is connected to a collector of the transistor Q1, and an emitter of the transistor Q1 is connected to the external terminal P3.

The transistor Q1 receives an abnormality detection signal SF on its base from an abnormality detection circuit 14. The abnormality detection signal SF generally becomes "H" level (power supply voltage VD level) in order to bring the transistor Q1 into an on state when at least one of plural abnormal phenomena occurs, and during a normal state in which none of the plural abnormal phenomena occurs, it becomes "L" level (ground voltage GND level) in order to bring the transistor Q1 into an off state.

On the other hand, a photocoupler 22 includes a light-emitting diode D22 and a phototransistor Q22, wherein an anode of the light-emitting diode D22 is connected to a positive electrode of the power supply 21, while a cathode is connected to the external terminal P2. When the light-emitting diode D22 emits light with intensity equal to or higher than a reference value, the phototransistor Q22 is turned on.

Therefore, when the transistor Q1 that is the abnormality output unit is turned on, the external terminal P2 and the external terminal P3 are electrically connected via the resistor R1 and the transistor Q1. As a result, (the abnormality output signal FO from) the external terminal P2 is set as "L", whereby potential difference that can emit light is generated between the anode and the cathode. Accordingly, the light-emitting diode D22 emits light with intensity equal to or higher than the reference value. Consequently, whether the error output signal FO is outputted or not can externally be detected by recognizing whether the phototransistor Q22 is in the on state or in the off state.

A fuse 13, a resistor R2, and a (NPN bipolar) transistor Q2, which serve as an abnormality history setting unit, are provided in series between the external terminal P1 and the external terminal P3. Specifically, one end of the fuse 13 is connected to the external terminal P1, the other end is connected to one end of the resistor R2, the other end of the resistor R2 is connected to a collector of the transistor Q2, and an emitter of the transistor Q2 is connected to the external terminal P3.

The transistor Q2 receives a specific abnormality detection signal S14 on its base from the abnormality detection circuit 14. The specific abnormality detection signal S14 generally becomes "H" level (power supply voltage VD level) in order to bring the transistor Q2 into an on state when a specific abnormal phenomenon to be detected occurs, and when the specific abnormal phenomenon does not occur, it becomes "L" level (ground voltage GND level) in order to bring the transistor Q2 into an off state.

When the transistor Q2 is brought into the on state by the specific abnormality detection signal S14 with the "H" level indicating the occurrence of the specific abnormal phenomenon to be detected, the abnormality history setting unit (the fuse 13, the resistor R2, and the transistor Q2) thus configured executes an abnormality history operation in which the external terminal P1 and the external terminal P3 are electrically connected via the fuse 13, the resistor R2, and the transistor Q2, and a current with a level exceeding a disconnection level is flown through the fuse 13 to disconnect the fuse 13.

The abnormality detection circuit 14 executes an abnormality detection operation for outputting the above-mentioned specific abnormality detection signal S14 and the abnormality detection signal SF. Although not illustrated, the abnormality detection circuit 14 uses the power supply voltage VD acquired from the external terminal P1 as an operating voltage. When the abnormal phenomenon that is the subject of the abnormality detection signal SF is only the specific abnormal phenomenon that is to be detected by the specific abnormality detection signal S14, the abnormality detection signal SF agrees with the specific abnormality detection signal S14.

As described above, the IPM 1 according to the first preferred embodiment can leave a history as to whether the specific abnormal phenomenon to be detected occurs or not from a condition as to whether the fuse 13 is disconnected or not by the abnormality history operation of the abnormality history setting unit including the fuse 13, the resistor R2, and the transistor Q2.

Whether the fuse 13 is disconnected or not can relatively easily be confirmed in the IPM 1 by providing a conduction check function of the fuse 13 to a control circuit (not illustrated) inside the IPM 1.

Since the IPM 1 can surely recognize whether the specific abnormal phenomenon to be detected occurs or not from a condition as to whether the fuse 13 is disconnected or not, the IPM 1 can promptly make an analysis and take a measure after the occurrence of the abnormal phenomenon. Accordingly, the life of the IPM 1 can be prolonged by using the IPM 1 with appropriate measures for error prevention being employed.

Second Preferred Embodiment

FIG. 2 is a circuit diagram schematically illustrating an abnormality output unit and an abnormality history setting unit of an IPM 2, and its periphery according to a second preferred embodiment of the present invention. The components (the abnormality output unit (Q1, R1), the abnormality detection circuit 14, the power supply 21, the photocoupler 22, and the external terminals P1 to P3, etc.) same as those in FIG. 1 are identified by the same numerals, and the redundant description will not be made.

The abnormality history setting unit in the IPM 2 includes a latch circuit 15 in addition to the fuse 13, the resistor R2, and the transistor Q2 which are the same as those in the first preferred embodiment. The IPM 2 also includes a fuse disconnection informing unit including an external terminal P4 (fuse disconnection informing terminal), a light-emitting diode D4 (LED; light-emitting element) connected to the external terminal P4, and a resistor R3, a transistor Q2, and the latch circuit 15 that are provided inside. Accordingly, the transistor Q2 and the latch circuit 15 are shared by the abnormality history setting unit and the fuse disconnection informing unit.

In the fuse disconnection informing unit, an anode of the light-emitting diode D4 is externally connected to the positive electrode of the power supply 21, a cathode thereof is connected to the external terminal P4, one end of the resistor R3 is connected to the external terminal P4, and the other end of the resistor R3 is connected to the other end of the resistor R2 (the collector of the transistor Q2).

The latch circuit 15 is composed of a flip-flop, and the like. When receiving the specific abnormality detection signal S14 with "H" level during the occurrence of the specific abnormal phenomenon to be detected, the latch circuit 15 executes a latch operation for holding this specific abnormality detection signal S14, and keeping the "H" state until a control power supply reset operation is performed. Although not illustrated, the latch circuit 15 uses the power supply voltage VD acquired from the external terminal P1 as an operating voltage. The control power supply reset operation means an operation of restarting the supply of the power supply voltage VD after the supply of the power supply voltage VD from the power supply 21 is temporarily stopped.

The abnormality history setting unit thus configured according to the second preferred embodiment executes an abnormality history operation similar to that performed by the abnormality history setting unit according to the first preferred embodiment by using, as a trigger, the state in which the specific abnormality detection signal S14 with the "H" level is latched by the latch circuit 15 during the occurrence of the specific abnormal phenomenon to be detected. Therefore, the abnormality history setting unit can disconnect the fuse 13. The abnormality history setting unit has an advantage of being capable of assuring a sufficient period until the fuse 13 is disconnected, since it includes the latch circuit 15.

On the other hand, the "H" level of the specific abnormality detection signal S14 is latched by the latch circuit 15 in the fuse disconnection informing unit, whereby a current with an amount capable of allowing the light-emitting diode D4 to emit light flows from the power supply 21 through a current path of the light-emitting diode D4 and the resistor R3 until the control power supply reset operation is executed, when or after the fuse 13 is disconnected upon the occurrence of the specific abnormal phenomenon.

As a result, the light-emitting diode D4 emits light, whereby whether the specific abnormal phenomenon occurs or not can easily be recognized visually from the outside from a condition as to whether the light-emitting diode D4 emits light or not.

As described above, the IPM 2 according to the second preferred embodiment can leave a history as to whether the specific abnormal phenomenon occurs or not from a condition as to whether the fuse 13 is disconnected or not by the abnormality history operation of the abnormality history setting unit including the fuse 13, the resistor R2, and the transistor Q2, as in the IPM 1 according to the first preferred embodiment.

Additionally, the IPM 2 according to the second preferred embodiment further includes the fuse disconnection informing unit (the combination of the latch circuit 15, the transistor Q2, the resistor R3, the external terminal P4, and the light-emitting diode D4) that controls the emission of the light-emitting diode D4 in response to the indication ("H" level) of the occurrence of the abnormal phenomenon from the specific abnormality detection signal S14.

The fuse disconnection informing unit controls the emission of the light-emitting diode D4 based upon whether the specific abnormality detection signal S14 with the "H" level is latched by the latch circuit 15 or not, i.e., based upon the content of the specific abnormality detection signal S14 indicating the occurrence of the specific abnormal phenomenon. Therefore, the fuse disconnection informing unit can promptly alarm that the fuse 13 is disconnected due to the occurrence of the specific abnormal phenomenon in a manner visually recognized.

Third Preferred Embodiment

FIG. 3 is a circuit diagram schematically illustrating an abnormality output unit and an abnormality history setting unit of an IPM 3, and its periphery according to a third preferred embodiment of the present invention. The components (the abnormality output unit, the abnormality detection circuit 14, the power supply 21, the photocoupler 22, and the external terminals P1 to P3, etc.) same as those in FIG. 1 are identified by the same numerals, and the redundant description will not be made.

The abnormality history setting unit in the IPM 3 includes a comparator 16 that outputs an IGBT shutoff signal SB1 in addition to the fuse 13, the resistor R2, and the transistor Q2 which are the same as those in the first preferred embodiment.

Specifically, a reference voltage Vref is applied to a positive input (+) of the comparator 16, and the other end (the collector of the transistor Q2) of the resistor R2 is connected to a negative input (−). The reference voltage Vref is set to be higher than the voltage (open voltage) on the other end of the resistor R2 that is in an open state when the fuse 13 is disconnected, and to be lower than the power supply voltage VD. Therefore, the comparator 16 generally outputs the IGBT shutoff signal SB1 with "L", since the voltage on the other end of the resistor R2 is almost the power supply voltage VD. Although not illustrated, the comparator 16 uses the power supply voltage VD acquired from the external terminal P1 as an operating voltage.

The abnormality history setting unit thus configured according to the third preferred embodiment executes an abnormality history operation similar to that by the abnormality history setting unit according to the first preferred embodiment by using, as a trigger, the state in which the specific abnormality detection signal S14 becomes the "H" level during the occurrence of the specific abnormal phenomenon to be detected. Accordingly, the abnormality history setting unit can disconnect the fuse 13.

When the fuse 13 is disconnected, the negative input of the comparator 16 has the open voltage to be lower than the reference voltage Vref, whereby the IGBT shutoff signal SB1 is changed from "L" to "H". A shutoff control for turning off the subject semiconductor element can be executed by the IGBT shutoff signal SB1 with "H".

FIG. 4 is an explanatory view schematically illustrating a shutoff control system of the IGBT that is a subject to be protected by the IGBT shutoff signal SB1. The IPM 3 includes a power switching unit 50 having an IGBT 56 that is a semiconductor element performing a switching operation and a control circuit 52 that controls the switching operation of the IGBT 56. It is to be noted that the IPM 1 and IPM 3, and IPM 4 to IPM 10 described later also include a structure corresponding to the power switching unit 50 and the control circuit 52.

As illustrated in FIG. 4, the control circuit 52 outputs a control signal S52 that forcibly turns off the IGBT 56 present in the power switching unit 50 in response to the IGBT shutoff signal SB1 with "H". FIG. 4 illustrates the control circuit 52 as a circuit also functioning as a drive circuit.

As described above, the IPM 3 according to the third preferred embodiment can leave a history as to whether the specific abnormal phenomenon to be detected occurs or not from a condition as to whether the fuse 13 is disconnected or not by the abnormality history operation of the abnormality history setting unit including the fuse 13, the resistor R2, and the transistor Q2, as in the IPM 1 according to the first preferred embodiment.

Additionally, the abnormality history setting unit according to the third preferred embodiment further includes the comparator 16, which is connected to the fuse 13 and outputs the IGBT shutoff signal SB with "H" instructing a shutoff setting for stopping the switching operation of the IGBT 56 when the fuse 13 is disconnected, as a shutoff instruction unit.

The control circuit 52 stops the switching operation of the IGBT 56 in response to the instruction ("H") of the shutoff setting by the IGBT shutoff signal SB1.

As described above, the comparator 16 that is the shutoff instruction unit in the abnormality history setting unit outputs the IGBT shutoff signal SB1 with "H" (disconnection instruction signal) instructing the shutoff setting upon the disconnection of the fuse 13 to surely avoid the execution of the switching operation by the IGBT 56 in the abnormal state in which the fuse 13 is disconnected, whereby the IPM 3 according to the third preferred embodiment can safely use the IGBT 56.

Fourth Preferred Embodiment

FIG. 5 is a circuit diagram schematically illustrating an abnormality output unit and an abnormality history setting unit of an IPM 4, and its periphery according to a fourth preferred embodiment of the present invention. The components (the abnormality output unit, the abnormality detection circuit 14, the power supply 21, the photocoupler 22, and the external terminals P1 to P3, etc.) same as those in FIG. 1 are identified by the same numerals, and the redundant description will not be made.

The abnormality history setting unit in the IPM 4 further includes an external terminal P5 (external fuse connection terminal) and a switch 23 (inter-terminal switch) externally provided between the external terminals P1 and P5 in addition to the fuse 13, the resistor R2, and the transistor Q2 which are the same as those in the first preferred embodiment.

The switch 23 is realized by, for example, a mechanical switch such as a DIP switch, and it can change an electrical connection between the external terminals P1 and P5. In the IPM 4, the fuse 13, the resistor R2, and the transistor Q2 are provided between the external terminals P1 and P3 via the switch 23 and the external terminal P5.

Therefore, when the switch 23 is closed (electrically connected), the IPM 4 has a circuit structure equivalent to that of the IPM 1 illustrated in FIG. 1 according to the first preferred embodiment. Specifically, when the switch 23 is closed, the abnormality history setting unit executes an abnormality history operation similar to that performed by the abnormality history setting unit according to the first preferred embodiment by using, as a trigger, the state in which the specific abnormality detection signal S14 becomes "H" upon the occurrence of the abnormal phenomenon to be detected, whereby the abnormality history setting unit can disconnect the fuse 13.

On the other hand, when the switch 23 is opened (electrically open), the abnormality history setting unit becomes an electrically open state (floating state), so that the abnormality history operation is invalidated. Therefore, the abnormality history setting unit cannot disconnect the fuse 13.

As described above, the IPM 4 according to the fourth preferred embodiment can leave a history as to whether the specific abnormal phenomenon to be detected occurs or not from a condition as to whether the fuse 13 is disconnected or not by the abnormality history operation of the abnormality history setting unit including the fuse 13, the resistor R2, and the transistor Q2 as main components, as in the IPM 1 according to the first preferred embodiment.

Additionally, in the IPM 4 according to the fourth preferred embodiment, the switch 23 can change the electrical connection between the external terminals P1 and P5 by opening or closing the switch 23, whereby the IPM 4 can selectively set such that the abnormality history operation by the abnormality history setting unit is valid or invalid.

As a result, the IPM 4 can relatively easily carry out a test for checking a protection function by invalidating the abnormality history operation and intentionally generating an error during the examination of the IPM 4, whereby the convenience of the device can be enhanced.

Fifth Preferred Embodiment

Figure 6:
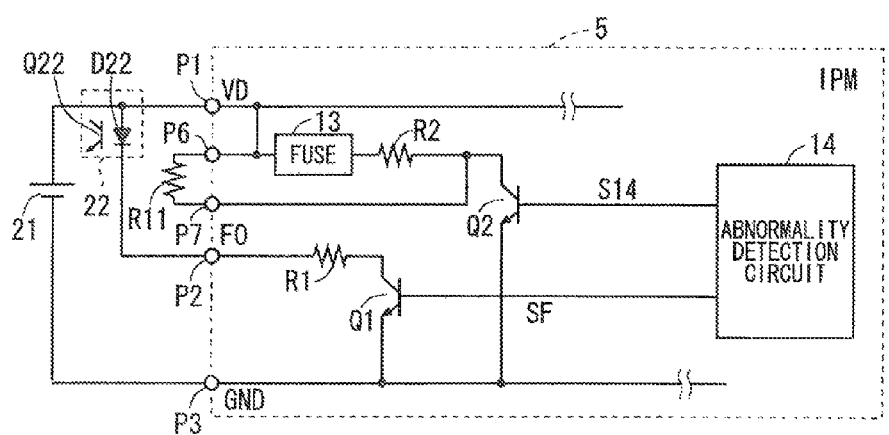
FIG. 6 is a circuit diagram illustrating an abnormality history setting unit in an IPM according to a fifth preferred embodiment of the present invention.

FIG. 6 is a circuit diagram schematically illustrating an abnormality output unit and an abnormality history setting unit of an IPM 5, and its periphery according to a fifth preferred embodiment of the present invention. The components (the abnormality output unit, the abnormality detection circuit 14, the power supply 21, the photocoupler 22, and the external terminals P1 to P3, etc.) same as those in FIG. 1 are identified by the same numerals, and the redundant description will not be made.

The abnormality history setting unit in the IPM 5 further includes external terminals P6 and P7 (first and second external fuse disconnection detection terminals) and a resistor R11 externally provided between the external terminals P6 and P7 in addition to the fuse 13, the resistor R2, and the transistor Q2 which are the same as those in the first preferred embodiment.

As described above, the IPM 5 according to the fifth preferred embodiment can leave a history as to whether the specific abnormal phenomenon to be detected occurs or not from a condition as to whether the fuse 13 is disconnected or not by the abnormality history operation of the abnormality history setting unit including the fuse 13, the resistor R2, and the transistor Q2, as in the IPM 1 according to the first preferred embodiment.

Additionally, the IPM 5 according to the fifth preferred embodiment can relatively easily recognize whether the fuse 13 is disconnected or not from the outside based on the electrical connection condition (conduction state or open state) between the external terminals P6 and P7.

Furthermore, the IPM 5 can selectively set such that the abnormality history operation is valid or invalid by controlling a shunt ratio of a current flowing through the resistor R11 and the fuse 13 under the adjustment of the resistance value of the resistor R11 provided between the external terminals P6 and P7.

Specifically, the resistance value of the resistor R11 is set to be sufficiently smaller than a combined resistance value of the fuse 13 and the resistor R2 to reduce the current flowing through the fuse 13 upon the occurrence of the abnormal phenomenon to be detected to a level by which the fuse 13 cannot be disconnected, whereby the abnormality history operation by the abnormality history setting unit can be invalidated. On the contrary, the abnormality history operation by the abnormality history setting unit can be validated by sufficiently increasing the resistance value of the resistor R11 more than the combined resistance value of the fuse 13 and the resistor R2.

Sixth Preferred Embodiment

Figure 7:
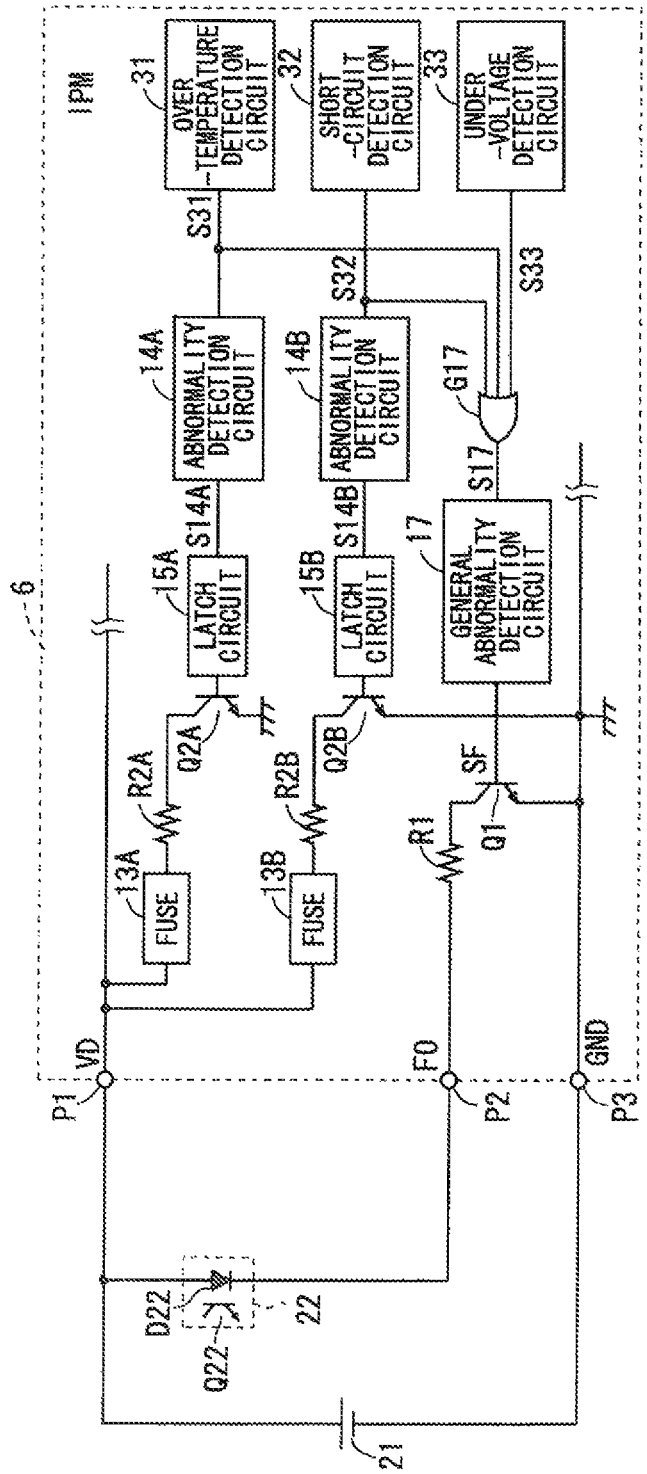
FIG. 7 is a circuit diagram illustrating an abnormality history setting unit in an IPM according to a sixth preferred embodiment of the present invention.

FIG. 7 is a circuit diagram schematically illustrating an abnormality output unit and an abnormality history setting unit of an IPM 6, and its periphery according to a sixth preferred embodiment of the present invention. The components (the abnormality output unit, the power supply 21, the photocoupler 22, and the external terminals P1 to P3, etc.) same as those in FIG. 1 are identified by the same numerals, and the redundant description will not be made.

The IPM 6 takes a countermeasure against three types of abnormal phenomena (plural types of abnormal phenomena) including an over-temperature abnormal phenomenon, a short-circuit abnormal phenomenon, and an under-voltage abnormal phenomenon, which are described later in detail.

The IPM 6 includes a first abnormality history setting unit provided with a fuse 13A, a resistor R2A, a (NPN bipolar) transistor Q2A, and a latch circuit 15A, and a second abnormality history setting unit provided with a fuse 13B, a resistor R2B, a (NPN bipolar) transistor Q2B, and a latch circuit 15B, as the abnormality history setting unit.

In the first abnormality history setting unit, the fuse 13A, the resistor R2A, and the transistor Q2A are provided in series between the external terminals P1 and P3. Specifically, one end of the fuse 13A is connected to the external terminal P1, the other end is connected to one end of the resistor R2A, the other end of the resistor R2A is connected to a collector of the transistor Q2A, and an emitter of the transistor Q2A is connected to the external terminal P3 (ground voltage GND level). An output from the latch circuit 15A latching a specific abnormality detection signal S14A is applied to a base of the transistor Q2A.

In the second abnormality history setting unit, the fuse 13B, the resistor R2B, and the transistor Q2B are provided in series between the external terminals P1 and P3. Specifically, one end of the fuse 13B is connected to the external terminal P1, the other end is connected to one end of the resistor R2B, the other end of the resistor R2B is connected to a collector of the transistor Q2B, and an emitter of the transistor Q2B is connected to the external terminal P3. An output from the latch circuit 15B latching a specific abnormality detection signal S14B is applied to a base of the transistor Q2B.

When receiving the specific abnormality detection signals 514A and 514B with "H" level during the occurrence of the specific abnormal phenomenon (the over-temperature abnormal phenomenon or the short-circuit abnormal phenomenon) to be detected, the latch circuits 15A and 15B execute a latch operation for holding these specific abnormality detection signals S14A and S14B, and keeping the "H" state until a control power supply reset operation is performed, as in the latch circuit 15 in the second preferred embodiment. Although not illustrated, the latch circuits 15A and 15B use the power supply voltage VD acquired from the external terminal P1 as an operating voltage.

The transistor Q2A receives on its base the specific abnormality detection signal S14A from the abnormality detection circuit 14A via the latch circuit 15A. The abnormality detection circuit 14A receives a temperature detection signal S31 from an over-temperature detection circuit 31. The temperature detection signal S31 is a detection signal for over temperature protection (OT). When the temperature detected by a temperature detection circuit (not illustrated) provided near the IGBT 56 (see FIG. 4) in the IPM 6 exceeds a reference temperature, the temperature detection signal S31 becomes "H" state indicating the occurrence of the over-temperature abnormal phenomenon.

The abnormality detection circuit 14A executes a first abnormality detection operation for outputting the specific abnormality detection signal S14A with "H" level that turns on the transistor Q2A when the temperature detection signal S31 is with "H", i.e., when the over-temperature abnormal phenomenon corresponding to a specific abnormal phenomenon to be detected out of three types of abnormal phenomena occurs, and for outputting the specific abnormality detection signal S14B with "L" level that turns off the transistor Q2A when the over-temperature abnormal phenomenon does not occur.

The transistor Q2B receives on its base the specific abnormality detection signal S14B from the abnormality detection circuit 14B via the latch circuit 15B. The abnormality detection circuit 14B receives a current detection signal S32 from a short-circuit detection circuit 32. The current detection signal S32 is a detection signal for short circuit protection (SC). When a current equal to or larger than a reference current flows through the IGBT 56 due to a load short circuit, the current detection signal S32 becomes "H" state indicating the occurrence of the short-circuit abnormal phenomenon.

The abnormality detection circuit 14B executes a second abnormality detection operation for outputting the specific abnormality detection signal S14B with "H" level that turns on the transistor Q2B when the current detection signal S32 is with "H", i.e., when the short-circuit abnormal phenomenon corresponding to a specific abnormal phenomenon to be detected out of three types of abnormal phenomena occurs, and for outputting the specific abnormality detection signal S14B with "L" level that turns off the transistor Q2B when the short-circuit abnormal phenomenon does not occur.

The base of the transistor Q1 receives an abnormality detection signal SF from a general abnormality detection circuit 17. The general abnormality detection circuit 17 outputs the abnormality detection signal SF with "H"/"L" from the "H"/"L" of a general detection signal S17 of an OR gate G17.

The OR gate G17 receives the temperature detection signal S31 on its first input, the current detection signal S32 on its second input, and a power supply detection signal S33 on its third input. The power supply detection signal S33 is a detection signal for power supply under voltage (UV) protection. When the power supply voltage VD (correctly, the potential difference between the power supply voltage VD and the ground potential GND) becomes not more than a set value, the power supply detection signal S33 becomes "H" state indicating the occurrence of the power supply under voltage abnormal phenomenon.

Accordingly, the general abnormality detection circuit 17 outputs the abnormality detection signal SF with "H", when at least one of the detection signals S31 to S33 becomes "H", i.e., when at least one of three types of the abnormal phenomena, which are the over-temperature abnormal phenomenon, the short-circuit abnormal phenomenon, and the power supply under voltage abnormal phenomenon, occurs.

When the transistor Q1 that is the abnormality output unit becomes the on state by the abnormality detection signal SF with "H", the external terminal P2 (the abnormality output signal FO from the external terminal P2) is set as "L", and the potential difference by which light can be emitted is generated between the anode and the cathode, whereby the light-emitting diode D22 emits light with intensity not less than the reference value, as described in the first preferred embodiment.

When the transistor Q2A becomes the on state by the latch of the specific abnormality detection signal S14A with "H" indicating the occurrence of the over-temperature abnormal phenomenon to the latch circuit 15A, the above-mentioned first abnormality history setting unit (the fuse 13A, the resistor R2A, the transistor Q2A, and the latch circuit 15A) executes a first abnormality history operation for electrically connecting the external terminals P1 and P3 via the fuse 13A, the resistor R2A, and the transistor Q2A, and allowing a current with a level exceeding a disconnection level to flow through the fuse 13A to disconnect the fuse 13A.

Similarly, when the transistor Q2B becomes the on state by the latch of the specific abnormality detection signal S14B with "H" indicating the occurrence of the short-circuit abnormal phenomenon to the latch circuit 15B, the above-mentioned second abnormality history setting unit (the fuse 13B, the resistor R2B, the transistor Q2B, and the latch circuit 15B) executes a second abnormality history operation for electrically connecting the external terminals P1 and P3 via the fuse 13B, the resistor R2B, and the transistor Q2B, and allowing a current with a level exceeding a disconnection level to flow through the fuse 13B to disconnect the fuse 13B.

The latch circuits 15A and 15B are effective for assuring a time taken for surely disconnecting the fuses 13A and 13B, but the above-mentioned first and second abnormality history setting operations can be executed even by a configuration in which the specific abnormality detection signals S14A and S14B are directly applied to the bases of the transistors Q2A and Q2B without providing the latch circuits 15A and 15B.

As described above, the first and second abnormality history setting units in the IPM 6 according to the sixth preferred embodiment independently execute the first and the second abnormality history operations, whereby they can leave histories as to whether the over-temperature abnormal phenomenon and the short-circuit abnormal phenomenon occur or not in such a manner that these histories can be identified between the over-temperature abnormal phenomenon and the short-circuit abnormal phenomenon from the condition as to whether the fuses 13A and 13B are disconnected or not. Specifically, which one of the two specific abnormal phenomena occurs on the IPM 6 can correctly be recognized by identifying the disconnection of the fuse 13A or the fuse 13B.

Whether the fuse 13A and the fuse 13B are disconnected or not can relatively easily be confirmed in the IPM 6 by providing a conduction check function of the fuses 13A and 13B to the control circuit (not illustrated) in the IPM 6.

As a result, the IPM 6 can promptly make an analysis and take a measure for each of the over-temperature abnormal phenomenon and the short-circuit abnormal phenomenon after the occurrence of the over-temperature abnormal phenomenon and the short-circuit abnormal phenomenon. Accordingly, the life of the IPM 6 can be prolonged by using the IPM 6 with appropriate measures for error prevention being employed.

Since the abnormality output unit (the transistor Q1 and the resistor R1) in the IPM 6 receives the abnormality detection signal SF generated by the general abnormality detection circuit 17 based upon the general detection signal S17 from the OR gate G17, it outputs an error output signal FO with "L" level indicating the abnormal phenomenon from the external terminal P2, when at least one of three types of the abnormal phenomena (over-temperature abnormal phenomenon, short-circuit abnormal phenomenon, and power supply under voltage abnormal phenomenon) occurs.

Accordingly, the IPM 6 can relatively easily recognize the occurrence of any one of the plural types of the abnormal phenomena from the outside by detecting the error output signal FO with "L" level from the external terminal P2.

In the sixth preferred embodiment, two abnormality history setting units are provided. However, it is obvious that the IPM 6 according to the sixth preferred embodiment is extended to realize a configuration in which three or more abnormality history setting units are provided.

Specifically, the specific abnormality detection signal may include first to Nth specific abnormality detection signals detecting first to Nth (N≥2) specific abnormal phenomena, the abnormality detection operation may include first to Nth abnormality detection operations, the fuse may include first to Nth fuses, and the abnormality history operation may include first to Nth abnormality history operations.

In this case, the abnormality detection circuit includes first to Nth abnormality detection circuits executing first to Nth abnormality detection operations outputting first to Nth abnormality detection signals indicating whether first to Nth abnormal phenomena included in the plural types of abnormal phenomena occur or not.

The abnormality history setting unit includes first to Nth abnormality history setting units provided corresponding to the first to Nth abnormality detection circuits and having the first to Nth fuses. When the first to Nth abnormality detection signals indicate the occurrence of the abnormal phenomenon, the first to Nth abnormality history setting units execute the first to Nth abnormality history operations for allowing a current to flow through the first to Nth fuses to disconnect these fuses.

Seventh Preferred Embodiment

FIG. 8 is a circuit diagram schematically illustrating an abnormality output unit and an abnormality history setting unit of an IPM 7, and its periphery according to a seventh preferred embodiment of the present invention. The components (the abnormality output unit, the abnormality detection circuits 14A and 14B, the latch circuits 15A and 15B, the general abnormality detection circuit 17, the OR gate G17, the power supply 21, the photocoupler 22, the over-temperature detection circuit 31, the short-circuit detection circuit 32, the under-voltage detection circuit 33, and the external terminals P1 to P3, etc.) same as those in FIG. 7 are identified by the same numerals, and the redundant description will not be made.

A first abnormality history setting unit in the IPM 7 includes the fuse 13A, the resistor R2A, the transistor Q2A, and the latch circuit 15A, those of which are the same as those in the sixth preferred embodiment. The IPM 7 also includes a first fuse disconnection informing unit including an external terminal P4A (first fuse disconnection informing terminal) and a light-emitting diode D4A (LED; first light-emitting element) connected to the external terminal P4A, and a resistor R3A, the transistor Q2A, and the latch circuit 15A, which are provided inside.

Similarly, a second abnormality history setting unit in the IPM 7 includes the fuse 13B, the resistor R2B, the transistor Q2B, and the latch circuit 15B, those of which are the same as those in the sixth preferred embodiment. The IPM 7 also includes a second fuse disconnection informing unit including an external terminal P4B (second fuse disconnection informing terminal) and a light-emitting diode D4B (LED;

second light-emitting element) connected to the external terminal P4B, and a resistor R3B, the transistor Q2B, and the latch circuit 15B, which are provided inside.

The transistor Q2A and the latch circuit 15A are shared by the first abnormality history setting unit and the first fuse disconnection informing unit, and the transistor Q2B and the latch circuit 15B are shared by the second first abnormality history setting unit and the second fuse disconnection informing unit.

Specifically, anodes of the light-emitting diodes D4A and D4B are commonly connected to the positive electrode of the power supply 21, cathodes are connected to the external terminals P4A and P4B, one end of each of the resistors R3A and R3B is connected to each of the external terminals P4A and P4B, and the other end of each of the resistors R3A and R3B are connected to the other end (a collector of the transistor Q2A and a collector of the transistor Q2B) of each of the resistors R2A and R2B.

The first abnormality history setting unit thus configured in the seventh preferred embodiment executes a first abnormality history operation same as the first abnormality history setting unit in the sixth preferred embodiment by using, as a trigger, the state in which the specific abnormality detection signal S14A with "H" is latched by the latch circuit 15A upon the occurrence of the over-temperature abnormal phenomenon, whereby the first abnormality history setting unit can disconnect the fuse 13A.

Since the "H" level of the specific abnormality detection signal S14A is latched by the latch circuit 15A in this case, the current from the power supply 21 flows through the current path of the light-emitting diode D4A and the resistor R3A when and after the fuse 13A is disconnected upon the occurrence of the over-temperature abnormal phenomenon.

As a result, the light-emitting diode D4A emits light, whereby whether the over-temperature abnormal phenomenon occurs or not can be informed to the outside in a manner visually recognized from a condition as to whether the light-emitting diode D4A emits light or not.

Similarly, the second abnormality history setting unit executes a second abnormality history operation same as the second abnormality history setting unit in the sixth preferred embodiment by using, as a trigger, the state in which the specific abnormality detection signal S14B with "H" is latched by the latch circuit 15B upon the occurrence of the short-circuit abnormal phenomenon, whereby the second abnormality history setting unit can disconnect the fuse 13B.

Since the "H" level of the specific abnormality detection signal S14B is latched by the latch circuit 15B in this case, the current from the power supply 21 flows through the current path of the light-emitting diode D4B and the resistor R3B when and after the fuse 13B is disconnected upon the occurrence of the short-circuit abnormal phenomenon.

As a result, the light-emitting diode D4B emits light, whereby whether the short-circuit abnormal phenomenon occurs or not can be informed to the outside in a manner visually recognized from a condition as to whether the light-emitting diode D4B emits light or not.

As described above, the IPM 7 according to the seventh preferred embodiment can leave histories as to whether the abnormal phenomenon to be detected occurs or not in such a manner that these histories can be identified between the over-temperature abnormal phenomenon and the short-circuit abnormal phenomenon from a condition as to whether the fuses 13A and 13B are disconnected or not according to the first and second abnormality history operations by the first and second abnormality history setting units respectively including the fuses 13A and 13B, the resistors R2A and R2B, and the transistors Q2A and Q2B, as in the IPM 6 according to the sixth preferred embodiment.

Additionally, the IPM 7 according to the seventh preferred embodiment further includes the first and second fuse disconnection informing units (abnormal phenomenon informing units) that control the emission of the light-emitting diodes D4A and D4B based upon the content ("H" or "L" level) of the specific abnormality detection signals S14A and S14B indicating the occurrence of the abnormal phenomenon.

The first and second fuse disconnection informing units control the emission of the light-emitting diodes D4A and D4B based upon the content of the specific abnormality detection signals S14A and S14B. Therefore, the first and second fuse disconnection informing units can quickly inform an outsider (a user using the photocoupler 22, and the light-emitting diodes D4A and D4B) of whether the fuses 13A and 13B are disconnected or not due to the occurrence of the over-temperature abnormal phenomenon or the short-circuit abnormal phenomenon.

Eighth Preferred Embodiment

Figure 9:
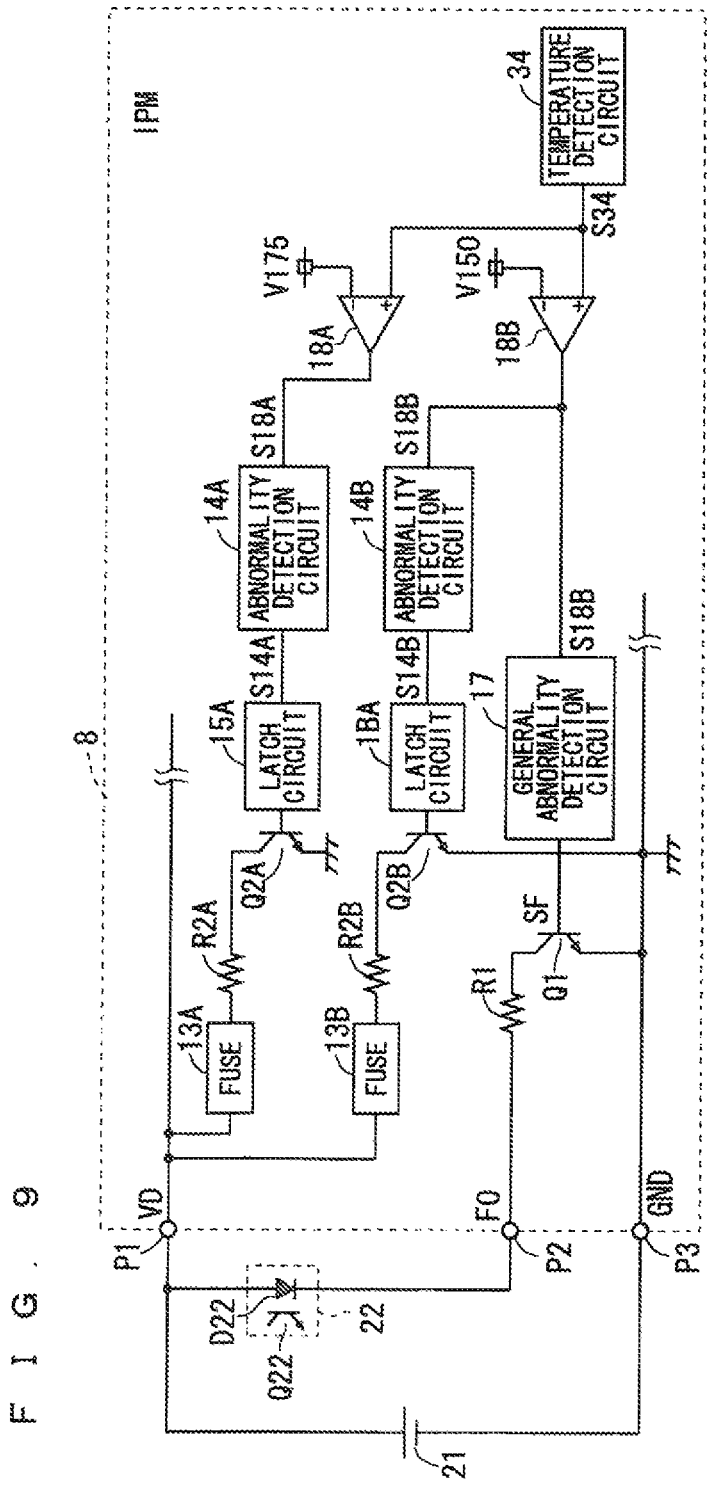
FIG. 9 is a circuit diagram illustrating an abnormality history setting unit in an IPM according to an eighth preferred embodiment of the present invention.

FIG. 9 is a circuit diagram schematically illustrating an abnormality output unit and an abnormality history setting unit of an IPM 8, and its periphery according to an eighth preferred embodiment of the present invention. The components (the abnormality output unit, the first and second abnormality history setting units, the abnormality detection circuits 14A and 14B, the latch circuits 15A and 15B, the general abnormality detection circuit 17, the power supply 21, the photocoupler 22, and the external terminals P1 to P3, etc.) same as those in FIG. 7 are identified by the same numerals, and the redundant description will not be made.

The abnormality detection circuit 14A inputs a comparator detection signal S18A, and outputs a specific abnormality detection signal S14A with "H"/"L" based upon "H"/"L" of the comparator detection signal S18A.

The abnormality detection circuit 14B inputs a comparator detection signal S18B, and outputs a specific abnormality detection signal S14B with "H"/"L" based upon "H"/"L" of the comparator detection signal S18B.

A temperature detection circuit 34 serving as a parameter detection circuit is provided near the IGBT 56 (see FIG. 4) in the IPM 8, and outputs a detected temperature signal S34 indicating a voltage based upon a detected temperature (a status parameter indicating the operating state of the IPM 8).

A comparator 18A receives a comparison voltage V175 (corresponding voltage when the detected temperature signal S34 indicates 175° C.) on its negative input, receives the detected temperature signal S34 on its positive input, and outputs the comparator detection signal S18A based upon the comparison result between the comparison voltage V175 and the detected temperature signal S34. Specifically, the comparator 18A outputs the comparator detection signal S18A that becomes "H" when the detected temperature signal S34 indicates a temperature exceeding 175° C., and outputs the comparator detection signal S18A that becomes "L" when the same signal indicates a temperature less than 175° C.

A comparator 18B receives a comparison voltage V150 (corresponding voltage when the detected temperature signal S34 indicates 150° C.) on its negative input, receives the detected temperature signal S34 on its positive input, and outputs the comparator detection signal S18B based upon the comparison result between the comparison voltage V150 and the detected temperature signal S34. Specifically, the comparator 18B outputs the comparator detection signal S18B that becomes "H" when the detected temperature signal S34 indicates a temperature exceeding 150° C., and outputs the comparator detection signal S18B that becomes "L" when the same signal indicates a temperature less than 150° C.

As described above, the comparators 18A and 18B function as parameter classification units that output two parameter classification signals, which are the comparator detection signals S18A and S18B, indicating whether two abnormal phenomena (in which the detected temperature is not less than (exceeds) 150° C., and in which the detected temperature is not less than (exceeds) 175° C.) classified based upon the detected temperature indicated by the detected temperature signal S34.

The general abnormality detection circuit 17 sets the abnormality detection signal SF as "H"/"L" based upon the "H"/"L" of the comparator detection signal S18B on receipt of the comparator detection signal S18B. Accordingly, when the detected temperature signal S34 indicates a temperature exceeding 150° C., the error output signal FO with "L" is outputted from the external terminal P2 by the abnormality output unit.

The first abnormality history setting unit thus configured according to the eighth preferred embodiment of the present invention executes a first abnormality history operation similar to that of the first abnormality history setting unit according to the sixth preferred embodiment by using, as a trigger, the condition in which the specific abnormality detection signal S14A becomes "H" (and is latched by the latch circuit 15A) upon the occurrence of the over-temperature abnormal phenomenon that is an over-temperature state exceeding 175° C. having high significance with the comparator detection signal S18A becoming "H". Accordingly, the abnormality history setting unit can disconnect the fuse 13A.

Similarly, the second abnormality history setting unit thus configured according to the eighth preferred embodiment of the present invention executes a second abnormality history operation similar to that of the second abnormality history setting unit according to the sixth preferred embodiment by using, as a trigger, the condition in which the specific abnormality detection signal S14B becomes "H" upon the occurrence of the over-temperature abnormal phenomenon that is an over-temperature state exceeding 150° C. having middle significance with the comparator detection signal S18B becoming "H". Accordingly, the abnormality history setting unit can disconnect the fuse 13B.

As described above, the IPM 8 according to the eighth preferred embodiment can leave histories as to whether the over-temperature abnormal phenomenon occurs or not and its level (significance) in such a manner that these histories can be identified between the over-temperature abnormal phenomenon with middle significance within a temperature range of 150° C. to 175° C. and the over-temperature abnormal phenomenon with high significance with a temperature exceeding 175° C. from a condition as to whether the fuses 13A and 13B are disconnected or not according to the first and second abnormality history operations by the first and second abnormality history setting units respectively including the fuses 13A and 13B, the resistors R2A and R2B, and the transistors Q2A and Q2B, as in the IPM 6 according to the sixth preferred embodiment.

Specifically, the IPM 8 can identify that the over-temperature abnormal phenomenon with high significance occurs when the fuses 13A and 13B are both disconnected, the over-temperature abnormal phenomenon with middle significance occurs when only the fuse 13B is disconnected, and the over-temperature abnormal phenomenon does not occur when neither the fuse 13A nor the fuse 13B is disconnected.

As described above, the IPM 8 according to the eighth preferred embodiment can recognize the history as to whether the two over-temperature abnormal phenomena, each having different temperature rise degree, occur or not from a condition as to whether the two fuses 13A and 13B are disconnected or not, each fuse corresponding to each of the over-temperature abnormal phenomena (at least two abnormal phenomena) with two levels (high significance, and middle significance) classified based upon the detected temperature indicated by the detected temperature signal S34 that is the common status parameter. As a result, the IPM 8 can promptly make an analysis and take a measure according to the detected temperature level after the occurrence of the over-temperature abnormal phenomena with two levels. Accordingly, the life of the IPM 8 can be prolonged by using the IPM 8 with appropriate measures for error prevention being employed.

Ninth Preferred Embodiment

Figure 10:
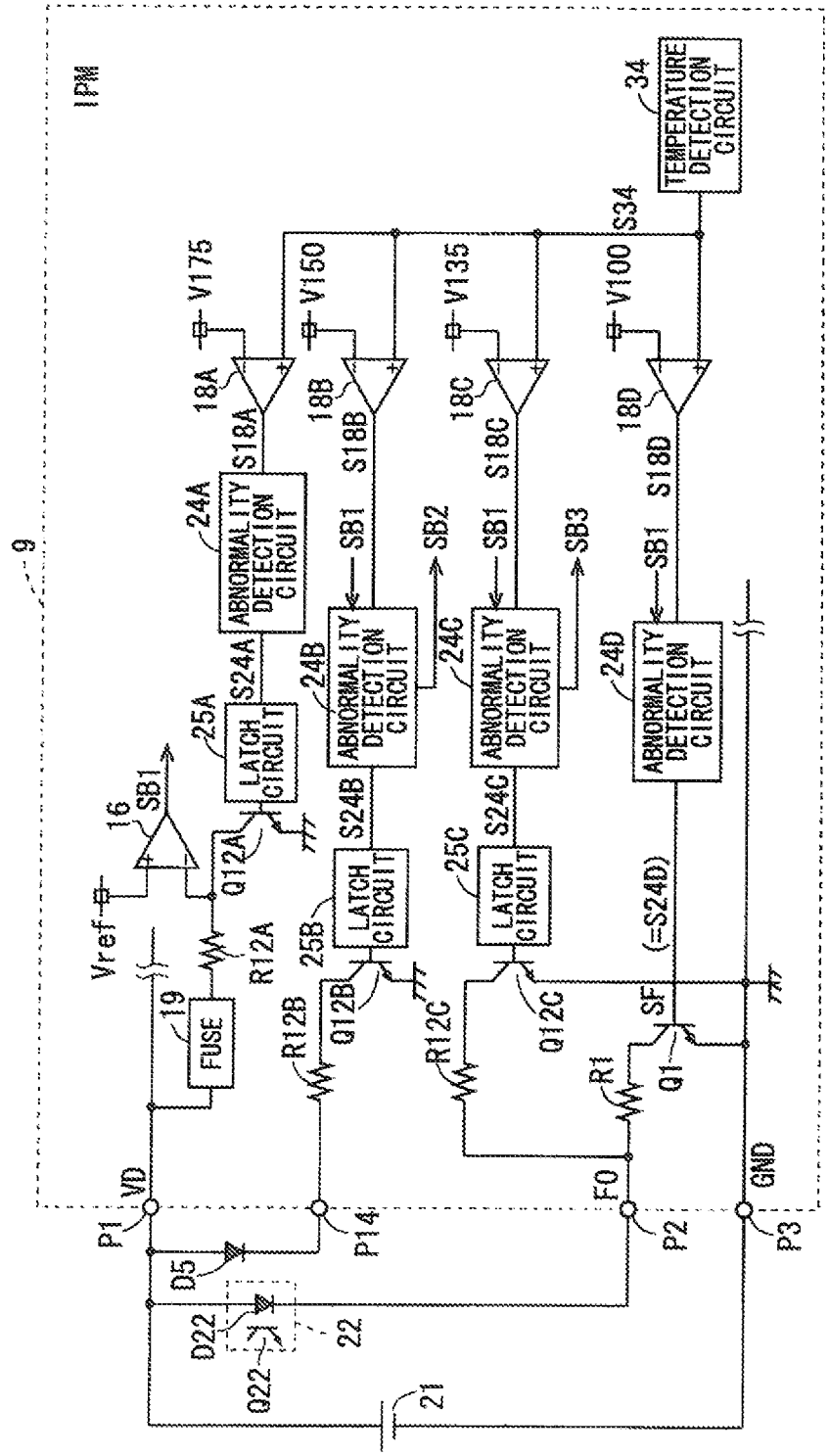
FIG. 10 is a circuit diagram illustrating an abnormality history setting unit in an IPM according to a ninth preferred embodiment of the present invention.

FIG. 10 is a circuit diagram schematically illustrating an abnormal phenomenon recognizing unit and an abnormality history setting unit of an IPM 9, and its periphery according to a ninth preferred embodiment of the present invention. The components (the abnormality output unit, the power supply 21, the photocoupler 22, and the external terminals P1 to P3, etc.) same as those in FIG. 1 are identified by the same numerals, and the redundant description will not be made.

An abnormality history setting unit in the IPM 9 includes a fuse 19, a resistor R12A, a (NPN bipolar) transistor Q12A, and a latch circuit 25A, wherein the fuse 19, the resistor R12A and the transistor Q12A are provided in series between the external terminal P1 and the external terminal P3.

Specifically, one end of the fuse 19 is connected to the external terminal P1, the other end is connected to one end of the resistor R12A, the other end of the resistor R12A is connected to a collector of the transistor Q12A, and an emitter of the transistor Q12A is connected to the external terminal P3 (ground voltage GND level). An output from the latch circuit 25A latching a specific abnormality detection signal S24A is applied to a base of the transistor Q12A.

The abnormality history setting unit further includes a comparator 16. A reference voltage Vref is applied to a positive input of the comparator 16, and the other end (the collector of the transistor Q12A) of the resistor R12A is connected to a negative input. The reference voltage Vref is set to be higher than the voltage (open voltage) on the other end of the resistor R12A that is in an open state when the fuse 19 is disconnected, and to be lower than the power supply voltage VD. Therefore, the comparator 16 generally outputs an IGBT shutoff signal SB1 with "L", when the fuse 19 is not disconnected.

The IPM 9 also includes first to third abnormal phenomenon recognizing units serving as abnormal phenomenon recognizing units, each of which does not have a fuse.

The first abnormal phenomenon recognizing unit includes a resistor R12B, a (NPN bipolar) transistor Q12B, a latch circuit 25B, an external terminal P14, and a light-emitting diode D5. The second abnormal phenomenon recognizing unit includes a resistor R12C, a (NPN bipolar) transistor Q12C, and a latch circuit 25C.

In the first abnormal phenomenon recognizing unit, the light-emitting diode D5 is provided between the external terminal P1 and the external terminal P14. Specifically, an anode of the light-emitting diode D5 is connected to the external terminal P1, and a cathode is connected to the external terminal P14. The resistor R12B and the transistor Q12B are provided in series between the external terminal P14 and the external terminal P3. Specifically, one end of the resistor R12B is connected to the external terminal P14, the other end of the resistor R12B is connected to the collector of the transistor Q12B, and the emitter of the transistor Q12B is connected to the external terminal P3. An output from the latch circuit 25B latching a specific abnormality detection signal S24B is applied to the base of the transistor Q12B.

In the second abnormal phenomenon recognizing unit, the resistor R12C and the transistor Q12C are provided in series between the external terminals P2 and P3. Specifically, one end of the resistor R12C is connected to the external terminal P2, the other end of the resistor R12C is connected to the collector of the transistor Q12C, and the emitter of the transistor Q12C is connected to the external terminal P3. An output from the latch circuit 25C latching a specific abnormality detection signal S24C is applied to the base of the transistor Q12C.

When receiving the specific abnormality detection signals S24A to S24C with "H" level, the latch circuits 25A to 25C execute a latch operation for holding these specific abnormality detection signals S24A to S24C, and keeping the "H" state until a control power supply reset operation is performed, as in the latch circuit 15 according to the second preferred embodiment. Although not illustrated, the latch circuits 25A to 25C use the power supply voltage VD acquired from the external terminal P1 as an operating voltage.

The resistor R1 and the transistor Q1 provided between the external terminals P2 and P3 are used as the third abnormal phenomenon recognizing unit. The third abnormal phenomenon recognizing unit has a configuration equivalent to the abnormality output unit described in the first preferred embodiment to the eighth preferred embodiment, but it is different from the abnormality output unit in that the abnormality detection signal SF (specific abnormality detection signal S24D) outputted from the abnormality detection circuit 24D is received by the base of the transistor Q1.

The abnormality detection circuits 24A to 24D execute first to fourth abnormality detection operations for inputting comparator detection signals S18A to S18D, and outputting specific abnormality detection signal S24A to S24D with "H"/"L" based upon "H"/"L" of the comparator detection signals S18A to S18D.

The abnormality detection circuit 24B outputs an IGBT shutoff signal SB2 with "H" indicating the shutoff setting of the IGBT 56 together with the specific abnormality detection signal S24B with "H" (see FIG. 4). Similarly, the abnormality detection circuit 24C outputs an IGBT shutoff signal SB3 (see FIG. 4) with "H" indicating the shutoff setting of the IGBT 56 together with the specific abnormality detection signal S24C with "H" (see FIG. 4).

The temperature detection circuit 34 is provided near the IGBT 56 of the IPM 8, and outputs a detected temperature signal S34 indicating a voltage based upon the detected temperature, as in the eighth preferred embodiment.

A comparator 18A receives a comparison voltage V175 (corresponding voltage when the detected temperature signal S34 indicates 175° C.) on its negative input, receives the detected temperature signal S34 on its positive input, and outputs the comparator detection signal S18A based upon the comparison result between the comparison voltage V175 and the detected temperature signal S34.

A comparator 18B receives a comparison voltage V150 (corresponding voltage when the detected temperature signal S34 indicates 150° C.) on its negative input, receives the detected temperature signal S34 on its positive input, and outputs the comparator detection signal S18B based upon the comparison result between the comparison voltage V150 and the detected temperature signal S34.

A comparator 18C receives a comparison voltage V135 (corresponding voltage when the detected temperature signal S34 indicates 135° C.) on its negative input, receives the detected temperature signal S34 on its positive input, and outputs the comparator detection signal S18C based upon the comparison result between the comparison voltage V135 and the detected temperature signal S34.

A comparator 18D receives a comparison voltage V100 (corresponding voltage when the detected temperature signal S34 indicates 100° C.) on its negative input, receives the detected temperature signal S34 on its positive input, and outputs the comparator detection signal S18D based upon the comparison result between the comparison voltage V100 and the detected temperature signal S34.

Accordingly, the abnormality detection circuit 24A serves as a significant abnormality detection circuit that executes a first abnormality detection operation to the significant abnormal phenomenon having the highest degree of abnormality in the over-temperature abnormal phenomenon in which the detected temperature exceeds 175° C. The second to fourth abnormality detection operations by the abnormality detection circuits 24B to 24D are the second, the third, and the fourth detection operations in descending order of the degree of abnormality.

FIG. 11 is an explanatory view illustrating, in a form of a table, the abnormality history operation, the first to third abnormal recognizing operations, and cancel conditions in the IPM 9 according to the ninth preferred embodiment.

Firstly, the third abnormal recognizing operation (abnormality output operation) by the abnormality output unit (the resistor R1 and the transistor Q1) that is the third abnormal phenomenon recognizing unit will be described. The third abnormal phenomenon recognizing unit executes the third abnormal recognizing operation corresponding to an "alarm" mode when the detected temperature signal S34 outputted from the temperature detection circuit 34 indicates the state of "100° C. or higher (higher than 100° C.)".

Specifically, the third abnormal phenomenon recognizing unit executes the third abnormal recognizing operation for setting the error output signal FO as "L" during the period (Error period) when the abnormality detection signal SF (specific abnormality detection signal S24D) becomes "H". Accordingly, in the "alarm" mode, the IGBT 56 is not shut off, the light-emitting diode D5 does not emit light, and the fuse 19 is not disconnected.

The comparator 18D has a hysteresis function. When the detected temperature signal S34 becomes lower than a reset level (e.g., about 70° C.) that is the temperature lower than the detected temperature of 100° C. by a predetermined hysteresis temperature (e.g., about 30° C.) after the comparator detection signal S18D is changed to "H", the comparator detection signal S18D is changed from "H" to "L". With this, the abnormality detection signal SF (S24D) falls to "L", and the error output signal FO is changed to an open state from "L", whereby the "alarm" mode is canceled.

Next, the second abnormal recognizing operation by the second abnormal phenomenon recognizing unit (the resistor R12C, the transistor Q12C, and the latch circuit 25C) will be described. The second abnormal phenomenon recognizing unit executes the second abnormal recognizing operation corresponding to a "risk level: low" mode when the detected temperature signal S34 indicates the state of "135° C. or higher (higher than 135° C.)".

Specifically, the second abnormal phenomenon recognizing unit outputs an IGBT shutoff signal SB3 with "H" to shut off the IGBT 56 via the control circuit 52 (see FIG. 4), and always outputs the abnormality detection signal SF with "L" from the latch circuit 25C. In the "risk level: low" mode, the light-emitting diode D5 does not emit light, and the fuse 19 is not disconnected.

The comparator 18C has a hysteresis function. When the detected temperature signal S34 becomes lower than a reset level (e.g., about 115° C.) that is the temperature lower than the detected temperature of 135° C. by a predetermined hysteresis temperature (e.g., about 20° C.) after the comparator detection signal S18C is changed to "H", the comparator detection signal 518C is changed to "L". With this, the specific abnormality detection signal S24C and the IGBT shutoff signal SB3 fall to "L", whereby the shutoff setting of the IGBT 56 is canceled.

Since the specific abnormality detection signal S24 with "H" is latched by the latch circuit 25C, the state of always outputting the error output signal FO with "L" is maintained until the control power supply reset operation is carried out. In other words, the control power supply reset operation has to be carried out for canceling the state of always outputting the error output signal FO.

Next, the first abnormal recognizing operation by the first abnormal phenomenon recognizing unit (the resistor R12B, the transistor Q12B, the latch circuit 25B, the light-emitting diode D5, and the external terminal P14) will be described. The first abnormal phenomenon recognizing unit executes the first abnormal recognizing operation corresponding to a "risk level: middle" mode when the detected temperature signal S34 indicates the state of "150° C. or higher (higher than 150° C.)".

Specifically, the first abnormal phenomenon recognizing unit outputs an IGBT shutoff signal SB2 with "H" to shut off the IGBT 56 via the control circuit 52 (see FIG. 4), and turns on the transistor Q12B to allow the light-emitting diode D5 to emit light. In this case, the error output signal FO with "L" is always outputted from the latch circuit 25C in the second abnormal phenomenon recognizing unit. However, the fuse 19 is not disconnected.

In order to cancel the shutoff of the IGBT 56, the state of always outputting the error output signal FO, and the emission of the light-emitting diode D5 after the mode is changed to the "risk level: middle" mode, the above-mentioned control reset operation has to be carried out.

Next, the abnormality history operation by the abnormality history setting unit (the fuse 19, the resistor R12A, the transistor Q12A, the latch circuit 25A, and the comparator 16) will be described. The abnormality history setting unit executes the abnormality history operation corresponding to the "fatal" mode having high significance when the detected temperature signal S34 indicates the state of "175° C. or higher (higher than 175° C.)".

Specifically, the abnormality history setting unit outputs the IGBT shutoff signal SB1 with "H" from the comparator 16 to shut off the IGBT 56 via the control circuit 52 (see FIG. 4), and turns on the transistor Q12A to allow current exceeding the disconnection level to flow through the fuse 19 to disconnect the fuse 19. In this case, the light-emitting diode D5 emits light, and the error output signal FO with "L" is always outputted by the first and second abnormal phenomenon recognizing units.

In order to cancel the shutoff of the IGBT 56, the state of always outputting the error output signal FO, the emission of the light-emitting diode D5, and the disconnection of the fuse 19, the above-mentioned control reset operation has to be carried out after the fuse 19 is replaced.

The IGBT shutoff signal SB1 is inputted to each of the first to third abnormal phenomenon recognizing units, and the first to third abnormal phenomenon recognizing units execute the first to third abnormal recognizing operations in order to keep the corresponding mode ("alarm" mode, "risk level: low" mode, and "risk level: middle" mode) during when the IGBT shutoff signal SB1 is "H". Specifically, once the significant abnormal phenomenon that shows the "fatal" mode occurs, the first to third abnormal recognizing operations by the first to third abnormal phenomenon recognizing units are continued even after the control power supply reset operation is carried out, until the disconnected fuse 19 is replaced.

The IPM 9 according to the ninth preferred embodiment can recognize the history as to whether the fatal over-temperature abnormal phenomenon (significant abnormal phenomenon) occurs or not from a condition as to whether the fuse 19 is disconnected or not by the abnormality history operation by the abnormality history setting unit.

Additionally, since a variety of recognitions (emission of the light-emitting diode D5, the state of outputting the error output signal FO with "L" at all times or in a certain period of time) is externally possible by the first to third history recognizing operations by the first to third abnormal phenomenon recognizing units, whether the over-temperature abnormal phenomenon occurs or not can be recognized in such a manner that the over-temperature abnormal phenomenon is classified by using the recognition level (alarm, significance: low, significance: high) according to the temperature rise.

This point will be described in detail. Upon the occurrence of the over-temperature abnormal phenomenon, the temperature rising gradient of a chip temperature of the IGBT 56 is different, so that the maximum achieving temperature is different during a detection delay or during a delay till the measure such as the shutoff of the IGBT 56. The IPM 9 according to the ninth preferred embodiment has four comparators 18A to 18D, each having a different determination level, and the abnormality history setting unit and the first to third abnormal phenomenon recognizing units are provided to each of the comparators 18A to 18D. Accordingly, the IPM 9 can take various measures including the shutoff of the IGBT 56, the output of the error output signal FO, the emission of the light-emitting diode D5, and the disconnection of the fuse 19.

As a result, the IPM 9 can promptly make an analysis and take a measure according to the degree of significance after the occurrence of the abnormal phenomena commonly having the problem of the temperature rise. Accordingly, the life of the IPM 9 can be prolonged by using the IPM 9 with appropriate measures for error prevention being employed.

The IPM 9 surely avoids the IGBT 56 from performing the switching operation during the abnormal state in which the fuse 19 is disconnected by the IGBT shutoff signal SB1 (shutoff instruction signal) with "H" instructing the shutoff setting from the comparator 16 that is the shutoff instruction unit in the abnormality history setting unit, whereby the IGBT 56 can be used with safety.

Additionally, the first to third abnormal phenomenon recognizing units execute the first to third abnormal recognizing operations during when the IGBT shutoff signal SB1 is "H", whereby the IPM 9 can positively urge the replacement of the disconnected fuse 19 even after the control power supply reset operation is carried out after the occurrence of the significant abnormal phenomenon indicating the "fatal" mode.

Tenth Preferred Embodiment

Figure 12:
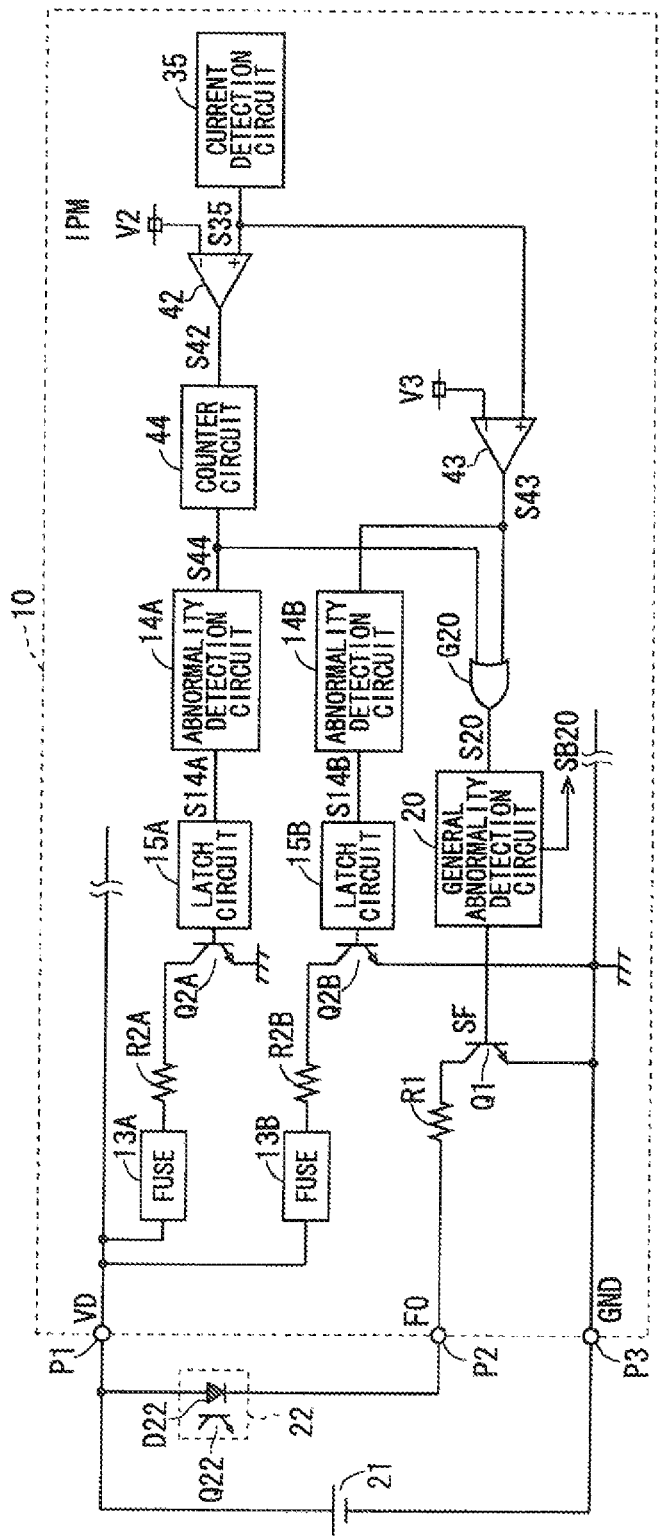
FIG. 12 is a circuit diagram illustrating an abnormality history setting unit in an IPM according to a tenth preferred embodiment of the present invention.

FIG. 12 is a circuit diagram schematically illustrating an abnormality output unit and an abnormality history setting unit of an IPM 10, and its periphery according to a tenth preferred embodiment of the present invention. The components (the abnormality output unit, the first and second abnormality history setting units, the abnormality detection circuits 14A and 14B, the latch circuits 15A and 15B, the power supply 21, the photocoupler 22, and the external terminals P1 to P3, etc.) same as those in FIG. 7 are identified by the same numerals, and the redundant description will not be made.

The abnormality detection circuit 14A inputs a counter detection signal S44, and outputs a specific abnormality detection signal S14A with "H"/"L" based upon "H"/"L" of the counter detection signal S44.

The abnormality detection circuit 14B inputs a comparator detection signal S43, and outputs a specific abnormality detection signal S14B with "H"/"L" based upon "H"/"L" of the comparator detection signal S43.

A current detection circuit 35 detects a collector current Ic of the IGBT 56 (see FIG. 4) in the IPM 10, and outputs a detected current signal S35 indicating a voltage value based upon the detected collector current Ic.

A comparator 42 receives a comparison voltage V2 (corresponding voltage when the detected current signal S35 indicates a twofold current that is double a rated current) on its negative input, receives the detected current signal S35 on its positive input, and outputs a comparator detection signal S42 based upon the comparison result between the comparison voltage V2 and the detected current signal S35. Specifically, the comparator 42 outputs the comparator detection signal S42 that becomes "H" when the detected current signal S35 indicates the collector current Ic (the amount of the collector current Ic) exceeding the twofold current and becomes "L" when the detected current signal S35 indicates the collector current Ic less than the twofold current.

A counter circuit 44 counts the number of times (initial value is "0") that the comparator detection signal S42 becomes "H", and when the count value reaches a set value, the counter circuit 44 outputs a counter detection signal S44 with "H". Specifically, the comparator 42 outputs, at the first time, the counter detection signal S44 with "H" when the detected current signal S35 indicates the collector current Ic exceeding the twofold current by the number of times of the set value.

A comparator 43 receives a comparison voltage V3 (corresponding voltage when the detected current signal S35 indicates a threefold current that is three times a rated current) on its negative input, receives the detected current signal S35 on its positive input, and outputs a comparator detection signal S43 based upon the comparison result between the comparison voltage V3 and the detected current signal S35. Specifically, the comparator 43 outputs the comparator detection signal S43 that becomes "H" when the detected current signal S35 indicates the collector current Ic exceeding the threefold current and becomes "L" when the detected current signal S35 indicates the collector current Ic less than the threefold current.

As described above, the comparators 42, 43 and the counter circuit 44 function as a parameter classifying unit that classifies two abnormal phenomena (the phenomenon in which the twofold rated current is generated the number of times of the set value, and the phenomenon in which the threefold rated current is generated once) based upon not only the current amount of the collector current Ic that is the status parameter but also the number of occurrences, and outputs two parameter classification signals as the comparator detection signal S43 and the counter detection signal S44.

An OR gate G20 receives the counter detection signal S44 on its one input, receives the comparator detection signal S43 on the other output, and outputs a logical OR signal of the counter detection signal S44 and the comparator detection signal S43 as a general detection signal S20.

A general abnormality detection circuit 20 outputs the abnormality detection signal SF with "H"/"L" based upon "H"/"L" of the general detection signal S20. Accordingly, the abnormality output unit outputs the error output signal FO with "L" from the external terminal P2, when the detected current signal S35 indicates the collector current Ic exceeding the twofold current the number of times of the set value, or when the detected current signal S35 indicates the collector current Ic exceeding the three-fold current.

The general abnormality detection circuit 20 also outputs an IGBT shutoff signal SB20 with "H" instructing the shutoff setting of the IGBT 56 upon the output of the abnormality detection signal SF with "H". The IGBT shutoff signal SB20 is a signal corresponding to the IGBT shutoff signals SB1 to SB3 described above. Therefore, the IGBT 56 can be shut off by the IGBT shutoff signal SB20 with "H" via the control circuit 52.

The first abnormality history setting unit thus configured according to the tenth preferred embodiment executes a first abnormality history operation similar to that of the first abnormality history setting unit according to the sixth preferred embodiment by using, as a trigger, a condition in which the specific abnormality detection signal S14A becomes "H" when the first-type short-circuit abnormal phenomenon occurs wherein the counter detection signal S44 becomes "H" and the state that the collector current Ic exceeds the twofold current occurs a number of times of the set value. Accordingly, the fuse 13A can be disconnected.

Similarly, the second abnormality history setting unit thus configured according to the tenth preferred embodiment executes a second abnormality history operation similar to that of the second abnormality history setting unit according to the sixth preferred embodiment by using, as a trigger, a condition in which the specific abnormality detection signal S14B becomes "H" when the second-type short-circuit abnormal phenomenon occurs wherein the comparator detection signal S43 becomes "H" and the state that the collector current Ic exceeds the threefold current occurs. Accordingly, the fuse 13B can be disconnected.

As described above, the IPM 10 according to the tenth preferred embodiment can leave histories as to whether the short-circuit abnormal phenomenon occurs or not and its abnormality type in such a manner that these histories can be identified between the case where the short-circuit abnormal phenomenon is the first type and the case where the short-circuit abnormal phenomenon is the second type, from a condition as to whether the fuses 13A and 13B are disconnected or not according to the first and second abnormality history operations by the first and second abnormality history setting units respectively including the fuses 13A and 13B, the resistors R2A and R2B, and the transistors Q2A and Q2B, as in the IPM 6 according to the sixth preferred embodiment.

Specifically, the IPM 10 can identify that the first-type short-circuit abnormal phenomenon occurs when the fuse 13A is disconnected, the second-type short-circuit abnormal phenomenon occurs when the fuse 13B is disconnected, and the short-circuit abnormal phenomenon does not occur when neither the fuse 13A nor the fuse 13B is disconnected.

As described above, the IPM 10 according to the tenth preferred embodiment can recognize the history as to whether the two short-circuit abnormal phenomena, each having different current rise degree, occur or not from a condition as to whether the two fuses 13A and 13B are disconnected or not, each fuse corresponding to each of two types of the short-circuit abnormal phenomena classified based upon the current amount of the collector current Ic indicated by the detected current signal S35 that is the status parameter.

Specifically, the IPM 10 can recognize the history as to whether each of two short-circuit abnormal phenomena, each having a different degree of abnormality including the number of occurrences in the common collector current Ic, from a condition as to whether the fuses 13A and 13B are disconnected or not, each fuse corresponding to each of two types of the short-circuit abnormal phenomena classified based upon the current amount and the number of occurrences of the collector current Ic that is the status parameter.

This point will be described in detail below. If the criterion for the short-circuit abnormal phenomenon is only one (e.g., the criterion in which the threefold current is defined as an SC level (short-circuit abnormality)), the IGBT 56 is not shut off under the condition where the collector current does not reach the threefold current in a short time, resulting in that the short-circuit (the short-circuit with a level exceeding the twofold current) might occur repeatedly. However, when the first and second abnormality history setting units are provided as in the IPM 10 according to the tenth preferred embodiment, the repeated short-circuit with a low peak current (exceeding the twofold current but not exceeding the threefold current) can also be protected. As a result, the IPM 10 can correctly recognize which type of the short-circuit abnormal phenomenon occurs (single occurrence of large current (threefold current), or repeated occurrence of low current (between twofold current and threefold current).

As described above, the IPM 10 according to the tenth preferred embodiment can shut off the IGBT 56 to protect the same, and can output the error output signal FO indicating the occurrence of the abnormality, when the case in which the peak current not less than the twofold rating but less than the threefold rating during the short-circuit occurs a plurality of times (set number of times) as well as when the case in which the peak current not less than the threefold rating during the short-circuit occurs. As a result, the IPM 10 can make an analysis and take a measure according to the type of short-circuit abnormality. Accordingly, the life of the IPM 10 can be prolonged by using the IPM 10 with appropriate measures for error prevention being employed.

Since the abnormality output unit (the transistor Q1 and the resistor R1) of the IPM 10 receives the abnormality detection signal SF generated by the general abnormality detection circuit 20 based upon the general detection signal S20 from the OR gate G20, it outputs the error output signal FO with "L" level indicating the abnormal phenomenon from the external terminal P2, when at least one of the two types of abnormal short-circuit phenomena occurs.

Accordingly, which type of the first-type short-circuit abnormal phenomenon or the second-type short-circuit abnormal phenomenon occurs can externally be recognized relatively easily by detecting the error output signal FO with "L" level from the external terminal P2.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a first external power supply terminal to which a power supply voltage is applied;
   a second external power supply terminal set to a reference potential;
   an abnormality detection circuit that executes an abnormality detection operation for outputting a specific abnormality detection signal indicating whether a specific abnormal phenomenon to be detected occurs or not; and
   an abnormality history setting unit that includes a fuse provided between said first and second external power supply terminals and executes an abnormality history operation for allowing a current to flow through said fuse to disconnect the fuse when said specific abnormality detection signal indicates the occurrence of said specific abnormal phenomenon,
   wherein said semiconductor device is capable of being used after said abnormality history setting unit has executed said abnormality history operation.

2. The semiconductor device according to claim 1, further comprising:
   a fuse disconnection informing unit including a fuse disconnection informing terminal and a light-emitting element provided at the outside and electrically connected to said fuse disconnection informing terminal; wherein
   said fuse disconnection informing unit controls an emission of said light-emitting element based upon a content of said specific abnormality detection signal indicating the occurrence of the specific abnormal phenomenon.

3. The semiconductor device according to claim 1, further comprising:
   a switching unit including a semiconductor element performing a switching operation; and
   a control circuit that controls the switching operation of said semiconductor element, wherein
   said abnormality history setting unit includes a shutoff instruction unit that is connected to said fuse and outputs a shutoff instruction signal instructing a shutoff setting for stopping the switching operation of said semiconductor element when said fuse is disconnected, and
   said control circuit stops the switching operation of said semiconductor element in response to the instruction of the shutoff setting from said shutoff instruction signal.

4. The semiconductor device according to claim 1, further comprising:
   an external fuse connection terminal electrically connected to one end of said fuse; and
   an inter-terminal switch that is provided at the outside and switchingly sets such that said first external power supply terminal and said external fuse connection terminal are electrically connected or disconnected, wherein said fuse is provided between said first and second external power supply terminals via said inter-terminal switch.

5. The semiconductor device according to claim 1, comprising:

a first external fuse disconnection detection terminal electrically connected to one end of said fuse; and a second external fuse disconnection detection terminal electrically connected to the other end of said fuse.

6. The semiconductor device according to claim 1, wherein said specific abnormal phenomenon includes plural types of abnormal phenomena, said specific abnormality detection signal includes first to Nth (N≥2) specific abnormality detection signals, said abnormality detection operation includes first to Nth abnormality detection operations, said fuse includes first to Nth fuses, and said abnormality history operation includes first to Nth abnormality history operations, said abnormality detection circuit includes first to Nth abnormality detection circuits that execute said first to Nth abnormality detection operations for outputting said first to Nth specific abnormality detection signals indicating whether the first to Nth abnormal phenomena included in said plural types of abnormal phenomena occur or not, said abnormality history setting unit is provided corresponding to each of the first to Nth abnormality detection circuits, and includes first to Nth abnormality history setting units having said first to Nth fuses, and said first to Nth abnormality history setting units execute said first to Nth abnormality history operations for allowing a current to flow through said first to Nth fuses to disconnect the first to Nth fuses, when said first to Nth specific abnormality detection signals indicate the occurrence of the abnormal phenomenon.

7. The semiconductor device according to claim 6, further comprising:

first to Nth abnormal phenomenon informing units including first to Nth fuse disconnection informing terminals, and first to Nth light-emitting elements that are provided at the outside corresponding to the first to Nth fuse disconnection informing terminals and are electrically connected to said first to Nth fuse disconnection informing terminals, wherein said first to Nth abnormal phenomenon informing units control an emission of said first to Nth light-emitting elements based upon a content of said first to Nth specific abnormality detection signals indicating the occurrence of the abnormal phenomenon.

8. The semiconductor device according to claim 6, further comprising:

a parameter detection circuit that detects a status parameter indicating an operating state of said semiconductor device; and a parameter classifying unit that outputs at least two parameter classification signals indicating whether at least two abnormal phenomena classified based upon a value of said status parameter occurs or not, wherein at least two abnormality detection circuits out of said first to Nth abnormality detection circuits execute the corresponding abnormality detection operation out of said first to Nth abnormality detection operations based upon said at least two parameter classification signals.

9. The semiconductor device according to claim 8, wherein said parameter classifying unit classifies said at least two abnormal phenomena based upon not only the value of said status parameter but also its number of occurrences, and outputs said at least two parameter classification signals.

10. The semiconductor device according to claim 6, further comprising:

an external detection terminal; and an abnormality output unit outputting an abnormality output signal indicating an occurrence of an abnormal phenomenon from said external detection terminal upon the occurrence of at least one of said plural types of the abnormal phenomena.

11. The semiconductor device according to claim 1, wherein said specific abnormal phenomenon includes plural types of abnormal phenomena classified based upon a degree of abnormality with respect to common abnormal phenomenon, said abnormality detection circuit includes plural abnormality detection circuits, each of which is provided to correspond to each of said plural types of abnormal phenomena, said abnormality detection circuits executing said abnormality detection operation for outputting plural specific abnormality detection signals indicating whether said plural types of abnormal phenomena occur or not as said specific abnormality detection signals, and said abnormality history setting unit is provided to correspond to a significant abnormality detection circuit that executes said abnormality detection operation for a significant abnormal phenomenon having the highest degree of abnormality out of said plural abnormality detection circuits, said semiconductor device further comprising at least one abnormal phenomenon recognizing unit that is provided to correspond to at least one of said plural abnormality detection circuits except for said significant abnormality detection circuit, and that executes an abnormal recognizing operation that can externally be recognized when the corresponding specific abnormality detection signal indicates the occurrence of the abnormal phenomenon.

12. The semiconductor device according to claim 11, further comprising:

a switching unit having a semiconductor element performing a switching operation; and a control circuit that controls the switching operation of said semiconductor element, wherein said abnormality history setting unit includes a shutoff instruction unit that is connected to said fuse and that outputs a shutoff instruction signal instructing a shutoff setting for stopping the switching operation of said semiconductor element upon a disconnection of said fuse, and said at least one abnormal phenomenon recognizing unit executes said abnormal recognizing operation during a period when said shutoff instruction signal instructs the shutoff setting.

* * * * *